US005306196A

United States Patent [19]

Hashiguchi

[11] Patent Number: 5,306,196

[45] Date of Patent: Apr. 26, 1994

[54] ELECTRIC CIRCUIT BOARD UNIT AND ELECTRIC CONNECTOR AND USE THEREIN

[75] Inventor: Osamu Hashiguchi, Tokyo, Japan

[73] Assignee: NEC Corporation, Japan

[21] Appl. No.: 10,658

[22] Filed: Jan. 28, 1993

[30] Foreign Application Priority Data

Jan. 30, 1992 [JP] Japan .............................. 4-2973[U]
Aug. 18, 1992 [JP] Japan .............................. 4-57965[U]

[51] Int. Cl.$^{5}$ .............................. H05K 9/00

[52] U.S. Cl. .............................. 439/607; 361/600; 439/660; 439/680

[58] Field of Search .................. 439/92, 95, 108, 607, 439/660, 680; 361/395, 399, 424; 174/35 R, 35 C, 35 GC

[56] References Cited

U.S. PATENT DOCUMENTS 4,789,847 12/1988 Sakamoto et al. .................. 439/607
5,053,613 10/1991 Onoda .................. 361/395
5,053,926 10/1991 Dickie .................. 361/424

*Primary Examiner*—Neil Abrams

*Attorney, Agent, or Firm*—Laff, Whitesel, Conte, Saret

[57] ABSTRACT

An electric circuit board unit includes an electric circuit board, electroconductive plates disposed at both sides of the electric circuit board, and an electric connector for making a connection between the circuit board and a cable connector. The electric connector comprises an insulator (15), a plurality of contacts mounted on the insulator, an electroconductive shell (17) attached to the insulator, and connecting means attached to the shell. The connecting means provides for connecting the electroconductive plates (3) and the shell (17) when the insulator is assembled in the unit. A coupling portion of the insulator has a plate portion (71), portions (21) of the contacts (16) being arranged on and along one surface thereof, and projecting portions being formed at both sides of the plate portion. The projecting portions (73) project toward one surface of the shell facing the contact portions. A coupling portion of the cable connector has a receiving hole (95) and receiving grooves (96) for receiving the coupling portion and the projecting portions of the electric connector, respectively, to prevent an incorrect connection between the electric connector and the cable connector.

11 Claims, 13 Drawing Sheets

ELECTRIC CIRCUIT BOARD UNIT AND ELECTRIC CONNECTOR AND USE THEREIN

BACKGROUND OF THE INVENTION

This invention relates to an electric connector for use in an electric circuit board unit and, in particular, to an electric connector which has a reduced thickness and a small size and which is capable of preventing electromagnetic interference (EMI) and electrostatic charge. This invention also relates to an electric circuit board unit with an electric connector of the type described.

A conventional electric circuit board unit comprises a frame, two electroconductive plates fixedly mounted on the frame, an electric circuit board located between the electroconductive plates and supported by the frame, and an electric connector attached to the frame. The electric connector comprises an insulator and a plurality of electroconductive contacts mounted on the insulator.

A CPU and/or a memory is mounted on the electric circuit board. In this connection, the electric circuit board unit is generally called an IC card or a memory card.

The electric circuit board unit is assembled in an electronic apparatus. At this time, the electric circuit board unit is connected through the electric connector to other circuit device mounted in the electronic apparatus. In order to provide protection against EMI or electrostatic charge, both electroconductive plates of the electric circuit board unit are connected to a ground terminal of the electronic apparatus in the interior of the electronic apparatus. Accordingly, the electric connector per se requires no protection against EMI. However, a troublesome wiring work is necessary for ground connection.

With recent development in multi-functional electronic apparatuses, it has been an increasing demand to further connect the electric circuit board unit with an external apparatus. For this purpose, another electric connector is additionally mounted in the electric circuit board unit. In this event, it is sometimes necessary to provide protection against EMI also for a combination of the other electric connector and the external apparatus. However, such protection is difficult if the other electric connector has a conventional structure. This is because it is impossible to connect both electroconductive plates of the electric circuit board unit and the ground terminal of the external apparatus without use of additional connection therebetween. Accordingly, a mating connector to be connected to the other electric connector must have a protecting structure against EMI. As a result, the mating connector inevitably has an increased size and an increased thickness.

In the meanwhile, each of the electric connector and the mating connector is provided with a coupling portion. The electric connector and the mating connector are connected when the respective coupling portions are coupled to each other. In order to avoid occurrence of a coupling error, the coupling portions have an eccentric structure so that they can be coupled only in a predetermined arrangement direction with respect to each other. Thus, coupling is inhibited in a false arrangement direction. However, if the electric connector has a reduced thickness, eccentricity of the coupling portions becomes small. This makes it difficult to provide a protecting structure against a coupling error.

SUMMARY OF THE INVENTION

It is an object of this invention to provide an electric connector for use in an electric circuit board unit, which can facilitate connection of conductive plates in the unit with a ground terminal of an apparatus equipped with the electric circuit board unit or an external apparatus.

It is another object of this invention to provide an electric connector for use in an electric circuit board unit, which has a small size and a reduced thickness and is still capable of avoiding a coupling error.

It is a further object of this invention to provide an electric circuit board unit having an electric connector with protection against EMI.

According to this invention, there is provided an electric connector for use in an electric circuit board unit including a frame, an electric circuit board having terminal pads and supported by the frame, electroconductive plates fixedly mounted on the frame to face the opposite surfaces of the electric circuit board with a gap left between the electric circuit board and each of the electroconductive plates, and the electric connector attached to the frame to connect the electric circuit board to an external circuit, the electric connector comprising an insulator to be fixedly mounted on the frame, a plurality of electroconductive contacts fixedly mounted on the insulator for connection with electroconductive mating contacts of a mating connector, each of the electroconductive contacts having a terminal portion to be connected to a corresponding one of the terminal pads, an electroconductive shell fixedly mounted on the insulator and isolated from the contacts, and connecting means connected to the electroconductive shell and extending outwardly of the insulator, the connecting means being for connecting the electroconductive shell with the electroconductive plates when the electric connector is mounted on the frame of the electric circuit board unit.

In the electric connector, the insulator may have a main surface and is provided with a coupling portion formed on the main surface. The electroconductive shell is attached to the insulator to surround the coupling portion. Each of the electroconductive contacts has a contact portion, a holding portion connected to one end of the contact portion and held in the insulator, and a terminal portion connected to one end of the holding portion and projecting on a subsidiary surface of the insulator opposite to the main surface. The coupling portion has a plate portion on which the contact portions are arranged along one surface thereof, and projecting portions formed on the main surface at both sides of the plate portion. The projecting portions project towards one surface of the electroconductive shell facing the one surface of the plate portion.

A connector to be connected to the electric connector, comprises an insulator, a plurality of electroconductive contacts fixedly mounted on the insulator, a coupling portion formed on a main surface of the insulator, and an electroconductive shell attached to the insulator to surround the coupling portion, each of the contacts comprising a contact spring portion, a holding portion connected to one end of the contact spring portion and held in the insulator, and a terminal portion connected to one end of the holding portion, the coupling portion having a receiving hole for receiving the coupling portion of the electric connector, the receiving hole being provided with receiving grooves at both ends thereof. The receiving hole is able to receive the projecting portion of the electric connector for permitting connection of the connector with the electric connector, whereby the plate portion of the coupling portion is received in the receiving hole so that the inner surface of the shell of the connector is electrically connected to the outer surface of a shell of the electric connector, with the spring contact portions being brought into contact with the contact portions.

According to this invention, there is also provided with an electric circuit board unit including a frame, an electric circuit board having terminal pads and supported by the frame, electroconductive plates fixedly mounted on the frame to face the opposite surfaces of the electric circuit board with a gap left between the electric circuit board and each of the electroconductive plates, and an electric connector attached to the frame to connect the electric circuit board to an external circuit, the electric connector comprising an insulator fixedly mounted on the frame a plurality of electroconductive contacts fixedly mounted on the insulator for connection with electroconductive mating contacts of a mating connector, each of the electroconductive contacts having a terminal portion connected to a corresponding one of the terminal pads, an electroconductive shell fixedly mounted on the insulator and isolated from the contacts; and connecting means connected to the electroconductive shell and extending outwardly of the insulator, the connecting means connecting the electroconductive shell with the electroconductive plates.

DESCRIPTION OF THE PREFERRED EMBODIMENTS

Prior to description of the preferred embodiments of this invention, a conventional electric circuit board unit will be described with reference to FIG. 1 for a better understanding of this invention.

Figure 1:
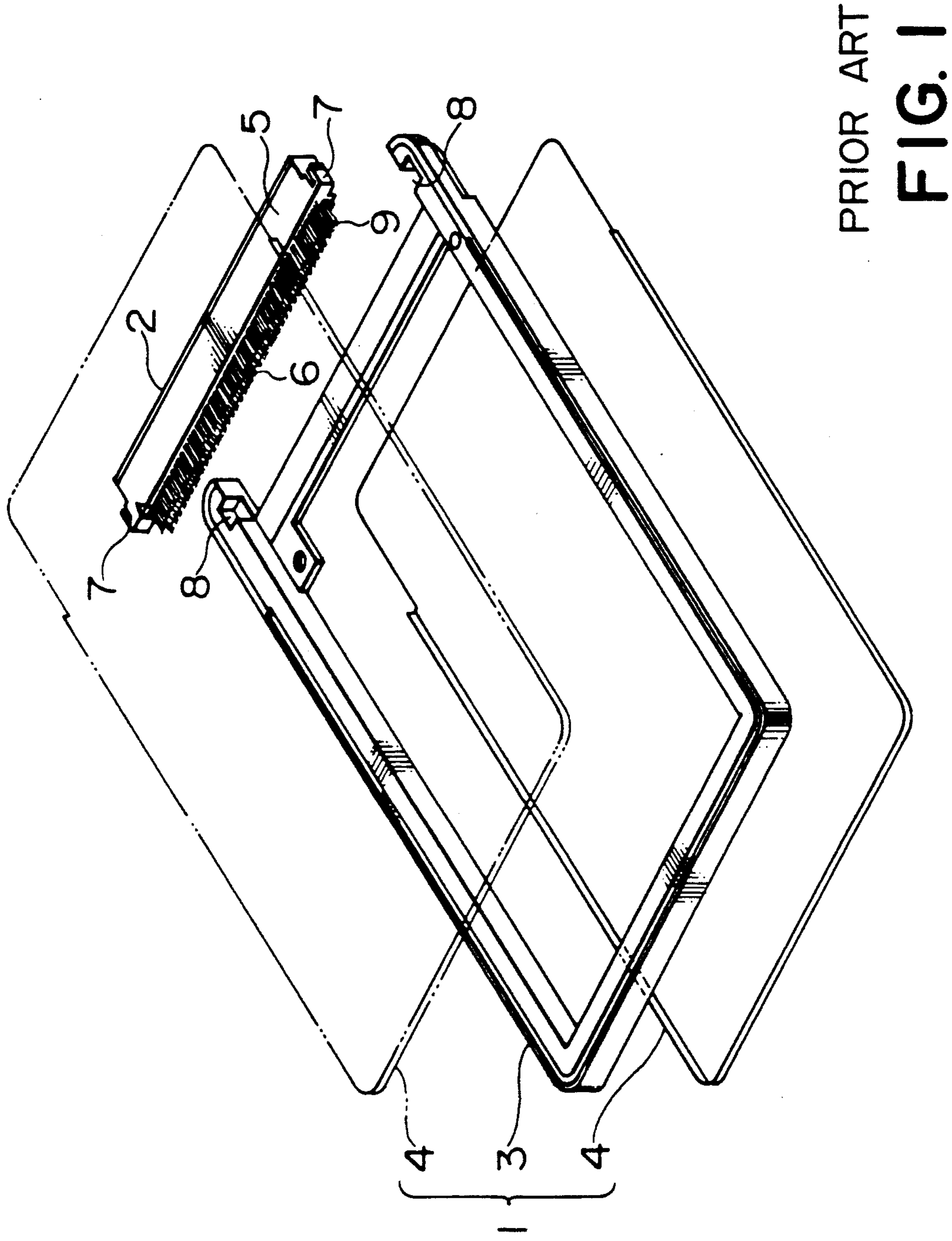
PRIOR ART FIG. 1
FIG. 1 is an exploded perspective view of a conventional electric circuit board unit.

Referring to FIG. 1, an electric circuit board unit comprises a frame 3, two thin electroconductive plates 4 fixedly mounted on the frame 3, an electric circuit board (not shown) located between the electroconductive plates 4 and supported by the frame 3, and an electric connector 2 attached to one end of the frame 3.

The electric connector 2 comprises an insulator 5 and a plurality of electroconductive contacts 6 fixedly mounted on the insulator 5. The contacts 6 are arranged in parallel rows along a longitudinal direction of the insulator 5. The insulator 5 is interposed between the plates 4. A pair of engaging projections 7 are formed at longitudinal opposite ends of the insulator 5, respectively. A pair of engaging recesses 8 are formed in the opposite inner sides of the frame 3 in the vicinity of the one end or an open end of the frame 3.

Although not shown in the figure, the electric circuit board is fixedly mounted within the frame 3 and located in a gap between the two plates 4. Terminal portions 9 of the contacts 6 are connected to terminal pads formed on the electric circuit board by means of soldering or the like.

The insulator 5 is provided with a coupling portion formed on a main surface thereof opposite to the terminal portions 9. The coupling portion is coupled with a counterpart coupling portion of a mating connector.

The electric circuit board unit 1 is mounted on an electronic apparatus and connected to a circuit device incorporated in the apparatus by coupling the electric connector with the mating connector connected to the circuit device through a cable.

The above-mentioned conventional electric connector has a disadvantage as described in the preamble of the instant specification.

Description will now be made as regards this invention with reference to the drawings.

Figure 2:
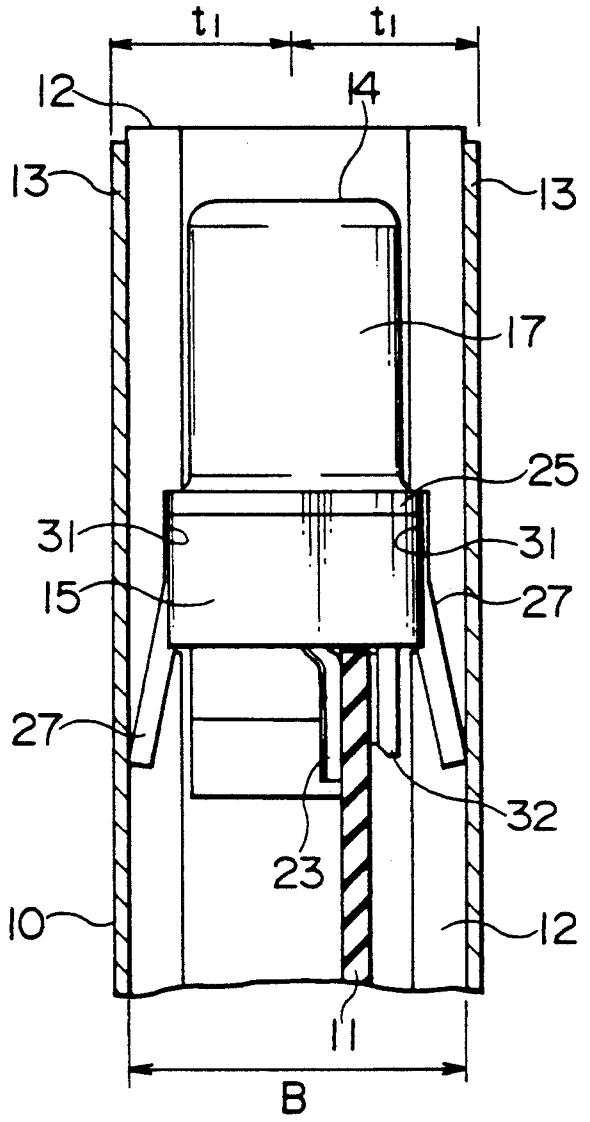
FIG. 2 is a sectional view of a part of an electric circuit board unit with an electric connector according to an embodiment of this invention.
Figure 3:
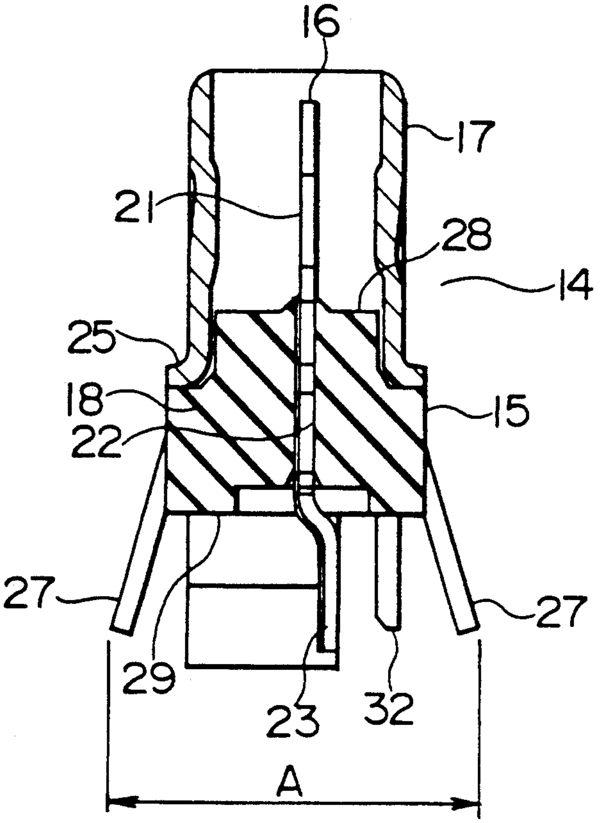
FIG. 3 is a sectional view of the electric connector illustrated in FIG. 2.
Figure 4:
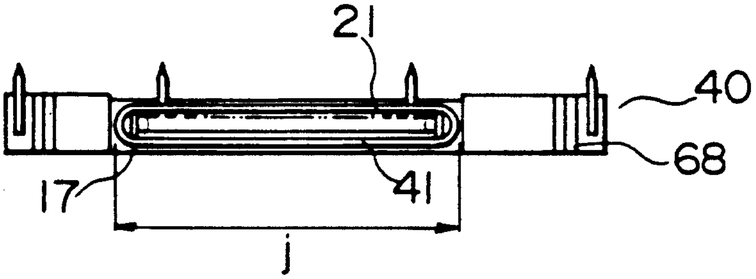
FIG. 4 is a front view of an electric connector according to another embodiment of this invention.
Figure 5:
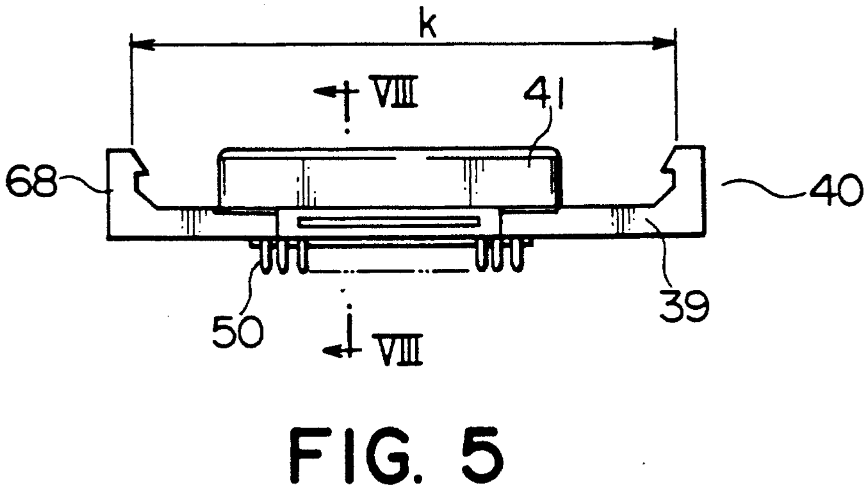
FIG. 5 is a plan view of the electric connector illustrated in FIG. 4.
Figure 6:
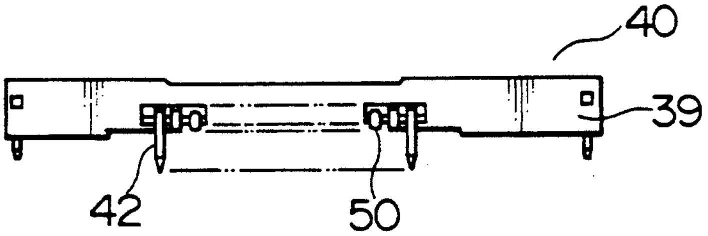
FIG. 6 is a rear view of the electric connector illustrated in FIG. 4.
Figure 7:
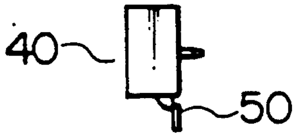
FIG. 7 is a side view of the electric connector illustrated in FIG. 4.

Referring to FIGS. 2 and 3, an electric circuit board unit 10 according to an embodiment of this invention comprises an electric connector 14, an electric circuit board 11, a frame 12 supporting the electric circuit board 11, and two thin electroconductive plates 13 facing opposite surfaces of the electric circuit board 11. Each of the plates 13 is fixedly mounted on the frame 12. The electric connector 14 and the electric circuit board 11 are arranged within a gap between the plates 13. The electric connector 14 is interposed between opposite sides of the frame 12.

The electric connector 14 comprises an insulator 15, a plurality of electroconductive contacts 16 fixedly mounted on the insulator 15 in parallel with one another, and an electroconductive shell 17 around the contacts 16.

The insulator 15 is provided with a pair of engaging projections 18 formed on opposite sides facing the plates 13.

Each of the contacts 16 comprises a contact portion 21 to be brought into contact with a corresponding one of mating contacts of a mating connector, a holding portion 22 held in the insulator 15, and a terminal portion 23 to be connected to a corresponding one of terminal pads formed on the electric circuit board 11 by means of soldering or the like. The contact portion 21 of each contact 16 stands on a main surface 28 of the insulator 15 and extends upwardly in the figure.

The shell 17 is located around the contact portions 21 of the contacts 16 with a predetermined space kept from the contact portions 21. The shell 17 is formed by bending a metal plate. A flange member 25 is formed to extend outwardly from a base end of the shell 17 and fixedly attached to the insulator 15. The shell 17 surrounds the contact portions 21 of the contacts 16. The shell 17 has, as connecting means, a plurality of elastically deformable protruding pieces 27 extending outwardly of the insulator 15. At least two protruding pieces 27 are formed on opposite sides of the shell 17 facing the opposite electroconductive plates 13. The protruding pieces 27 are brought into contact with the plates 13 when the electric connector 14 is attached to the frame 12 of the electric circuit board unit 10.

The protruding pieces 27 extend beyond a subsidiary surface 29 of the insulator 15 opposite to the main surface 28. These protruding pieces 27 are symmetrically located on the left and the right sides of the shell 17. The protruding pieces 27 are arranged so that a distance between the lefthand and the righthand protruding pieces 27 is increased from its proximal end on the shell 17 towards its top end. The protruding pieces 27 are integrally formed with the shell 17. However, the protruding pieces 27 may be separate metal plates and connected to the shell 17.

The shell 17 is provided with a ground terminal 32 extending from the subsidiary surface 29 of the insulator 15. The ground terminal 32 is connected to a ground pattern of the electric circuit board 11 by means of soldering or the like.

The frame 12 is provided with engaging recesses 31 for receiving the engaging projections 18 of the insulator 15. By fitting the engaging projections 18 with the engaging recesses 31, coupling and decoupling forces between the electric connector 14 and the mating connector are received by the frame 12. Accordingly, upon coupling and decoupling operations between the electric connector 14 and the mating connector, no destructive force is applied onto soldering portions between the terminal portions 23 of the contacts 16 and the terminal pads formed on the electric circuit board 11.

A distance A between the top ends of the lefthand and the righthand protruding pieces 27 is selected to be greater than a gap B between the electroconductive plates 13 ($A > B$). When the electric connector 14 is mounted on the electric circuit board unit 10, the protruding pieces 27 of the shell 17 are pressed by the plates 13 to be elastically deformed. In this event, the distance A between the top ends of the protruding pieces 27 is reduced to be equal to B. Thus, the shell 17 and the plates 13 are electrically connected through the protruding pieces 27 to assure protection against EMI.

Now, description will proceed to a practical example of the electric connector 14. In the electric circuit board unit 10, a distance t1 between a center of the electric connector 14 and each of the plates 13 is typically equal to 2.5 mm. Accordingly, the gap B between the plates 13 is slightly smaller than 5 mm. If the distance A between the top ends of the protruding pieces 27 is selected to be slightly greater than the gap B, the protruding pieces 27 are elastically deformed upon assembling of the electroconductive plates 13. Thus, electric connection is assured. Specifically, the distance A is selected from a range between 5.0 mm and 5.5 mm.

Since the shell 17 of the electric connector 14 and the plates 13 are electrically connected through inner surfaces of the plates 13, the electric connector 14 neither has a complicated structure nor an increased thickness.

For use in the electric circuit board unit 10, the electric connector 14 illustrated in FIGS. 2 and 3 may be replaced by an electric connector 40 illustrated in FIGS. 4 through 8. Instead of the protruding pieces 27 to be brought into contact with the plates 13 of the electric circuit board unit 10 illustrated in FIG. 2, the electric connector 40 is provided with protruding pieces 42 which are in contact with a shell 41 and project from a side surface of an insulator 39.

Figure 8:
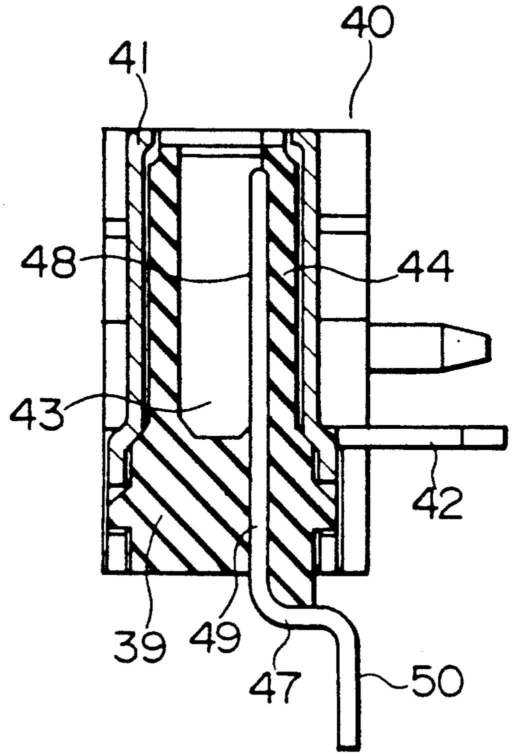
FIG. 8 is a sectional view taken along a line VIII—VIII in FIG. 5.
Figure 9:
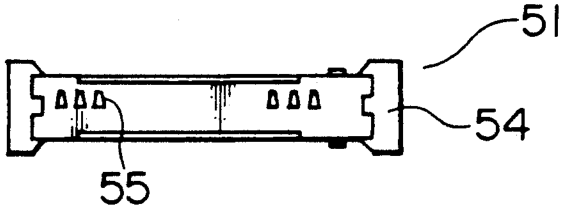
FIG. 9 is a rear view of a cable connector to mate with the electric connector illustrated in FIG. 4.
Figure 10:
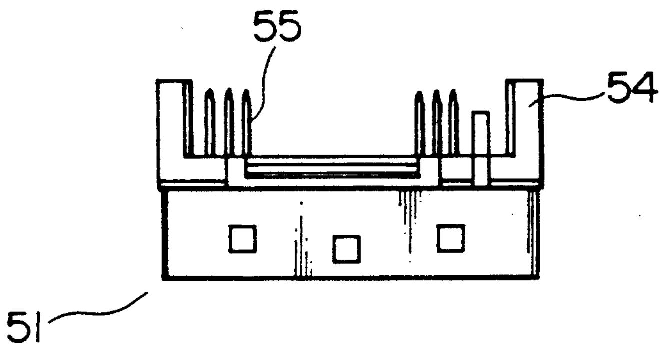
FIG. 10 is a plan view of the cable connector illustrated in FIG. 9.
Figure 11:
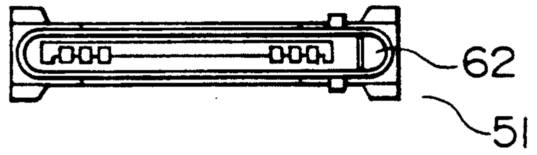
FIG. 11 is a front view of the cable connector illustrated in FIG. 9.
Figure 12:
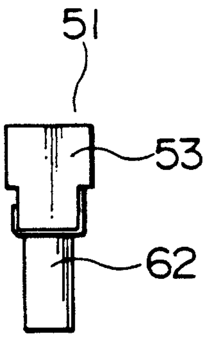
FIG. 12 is a side view of the cable connector illustrated in FIG. 9.
Figure 13:
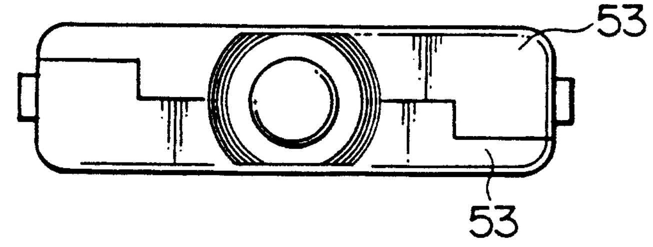
FIG. 13 is a rear view of the cable connector illustrated in FIG. 9 with a hood attached thereto.
Figure 14:
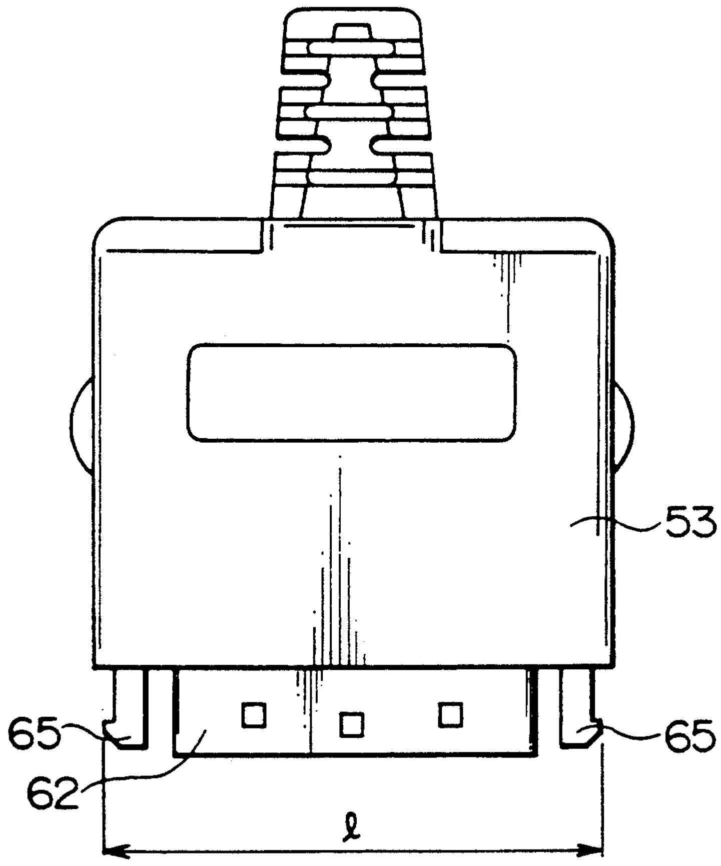
FIG. 14 is a plan view of the cable connector illustrated in FIG. 9 with the hood attached thereto.
Figure 15:
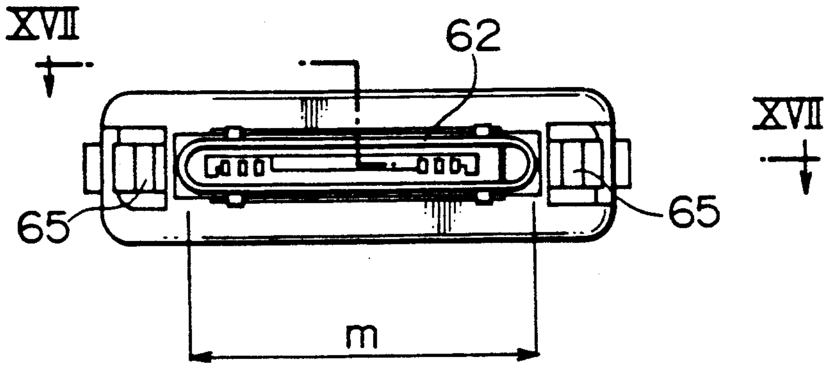
FIG. 15 is a front view of the cable connector illustrated in FIG. 9 with the hood attached thereto.
Figure 16:
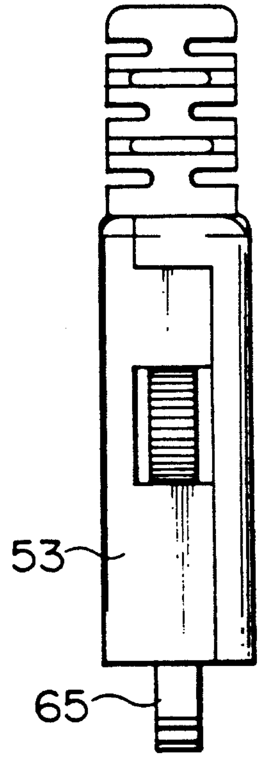
FIG. 16 is a side view of the cable connector illustrated in FIG. 9 with the hood attached thereto.
Figure 17:
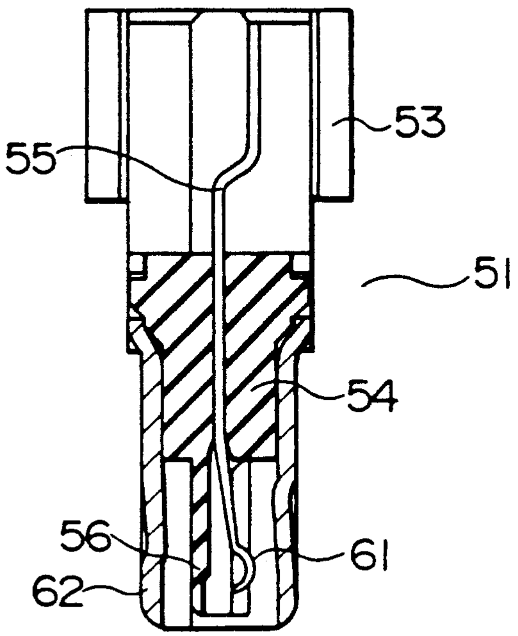
FIG. 17 is a sectional view taken along a line XVII—XVII in FIG. 15.
Figure 18:
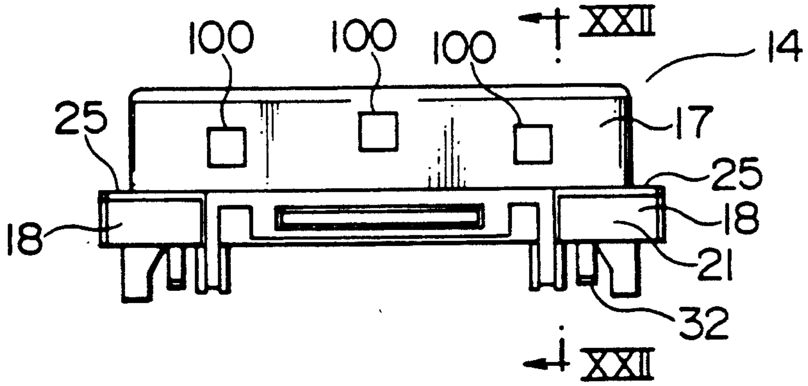
FIG. 18 is a plan view of an electric connector for use in an electric circuit board unit according to a further embodiment of this invention.
Figure 19:
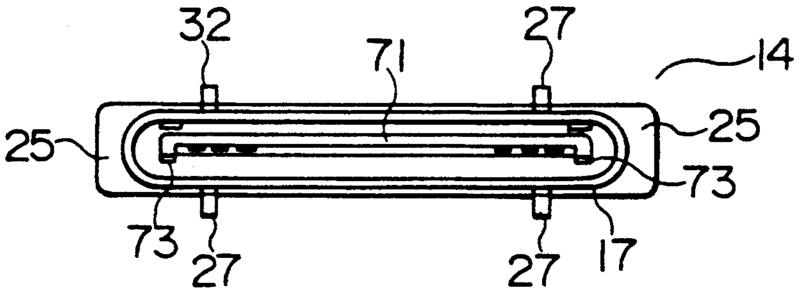
FIG. 19 is a front view of the electric connector illustrated in FIG. 18.
Figure 20:
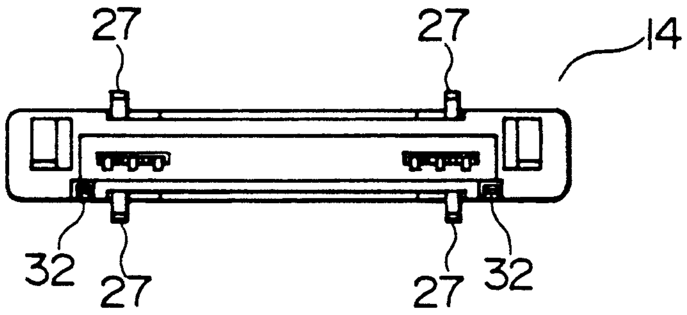
FIG. 20 is a rear view of the electric connector illustrated in FIG. 18.
Figure 21:
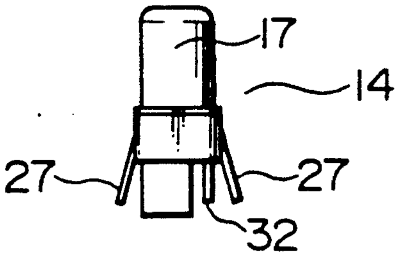
FIG. 21 is a side view of the electric connector illustrated in FIG. 18.

As best shown in FIG. 8, the electric connector 40 has a coupling portion 44 provided with a receiving hole 43 formed on one surface of the insulator 39. Each of electroconductive contacts 47 is a leaf type and comprises a contact portion 48, a holding portion 49 connected to one end of the contact portion 48, and a terminal portion 50 connected to one end of the holding portion 49. The contact portions 48 are arranged on a side wall surface of the receiving hole 43 to extend from an inner portion to an open end and spaced from one another in a predetermined direction. The holding portion 49 is held in the insulator 39. The shell 41 surrounds the coupling portion 44.

The electric connector 40 is connected to a mating connector or a cable connector 51 illustrated in FIGS. 9 through 17. The cable connector 51 illustrated in FIGS. 9 through 12 is covered by an insulating hood 53 as illustrated in FIGS. 13 through 17. The cable connector 51 comprises an insulator 54 and a plurality of electroconductive contacts 55. The insulator 54 holds the contacts 55 of a cantilevered type arranged at a predetermined space. The insulator 54 has a coupling portion 56. The coupling portion 56 is inserted into the receiving hole 43 of the insulator 39 illustrated in FIG. 8. A shell 62 is attached to the insulator 54 to surround the coupling portion 56 with a space left between the shell 62 and contact portions 61 of the contacts 55. The cable connector 51 and the shell 62 are fitted on the shell 41 upon connection with the electric connector 40.

A coupling error between the electric connector 40 and the cable connector 51 is inhibited by a structure which will presently be described. The shell 41 of the electric connector 40 is arranged so that the center of its length j (FIG. 4) is eccentric with the center of a distance k (FIG. 5) between engaging portions 68 formed on both longitudinal ends of the insulator 39. Correspondingly, the coupling portion 44 (the length m in FIG. 15) is rendered eccentric with the center of a distance l (FIG. 14) between locking portions 65 attached to the hood 53. In case when the both connectors are erroneously reversed with respect to each other in an arrangement direction, the locking portions 65 of the hood 53 of the cable connector 51 and the engaging portions 68 mutually interfere to thereby prevent an erroneous coupling.

However, the electric connector 40 inevitably has an increased longitudinal size because of provision of the locking portions 65 and the coupling portion 68. As a result, it is impossible to reduce a size of the electric connector 40.

FIGS. 18 through 22 show an improvement of the electric connector 14 illustrated in FIG. 3. The improved electric connector 14 has a small size and is still capable of inhibiting the erroneous coupling. Similar parts are designated by like reference numerals as those in the electric connector 14 illustrated in FIG. 3 and detailed description thereof will partially be omitted.

Referring to FIGS. 18 through 22, the electric connector 14 comprises the insulator 15 and a plurality of the electroconductive contacts 16 mounted on the insulator 15. The insulator 15 has a coupling portion 70 formed on the main surface 28. The electroconductive shell 17 is attached to the insulator 15. The electroconductive shell 17 surrounds the coupling portion 70. Each of the contacts 16 has the contact portion 21, the holding portion 22 connected to one end of the contact portion 21 and held in the insulator 15, and the terminal portion 23 connected to one end of the holding portion 22 and projecting on the subsidiary surface 29 opposite to the main surface 28. The coupling portion 70 has a plate portion 71 on which the contact portions 21 are arranged along one surface thereof, and projecting portions 73 formed on the main surface 28 at both ends of the plate portion 71. The projecting portions 73 project from both ends of the plate portion 71 towards one surface of the electroconductive shell 17 faced to the one surface of the plate portion 71.

Figure 22:
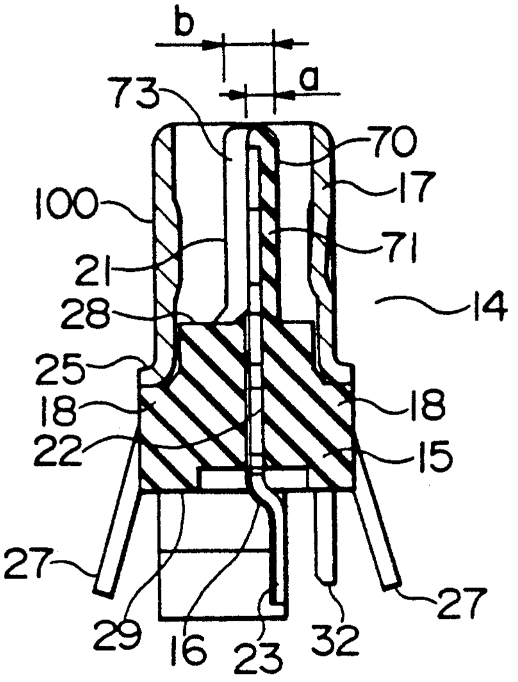
FIG. 22 is a sectional view taken along a line XXII—XXII in FIG. 18.
Figure 23:
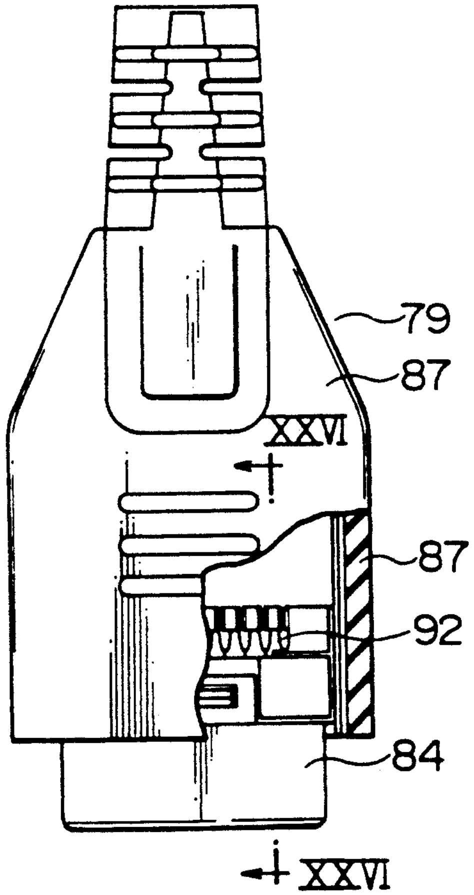
FIG. 23 is a plan view of a cable connector to mate with the electric connector illustrated in FIG. 18 with a hood attached thereto.

The plate portion 71 having a thickness a is arranged so that the center of the thickness a is located at an eccentric position on the main surface 28. Thus, a distance between the one surface of the plate portion 71 and the one surface of the electroconductive shell 17 and a distance between the other surface of the plate portion 71 and the other surface of the shell 17 are different from each other. As illustrated in FIG. 22, a distance between a righthand wall surface of the coupling portion 70 and the shell 17 is smaller than a distance between a lefthand wall surface of the coupling portion 70 and the shell 17. The contact portion 21 extends on and along the one surface of the plate portion 71. The contact portion 21 is located at a general center between the left and right opposite wall surfaces of the electroconductive shell 17. The plate portion 71 and the projecting portions 73 are arranged so that the center of a total thickness b is located at a general center between the opposite left and right surfaces of the electroconductive shell 17.

Referring to FIGS. 23 through 26, description will proceed to a mating connector or a cable connector 79 to be connected to the electric connector 14 illustrated in FIGS. 18 through 22. The cable connector 79 comprises an insulator 81 and a coupling portion 83 formed on a main surface 82 of the insulator 81. A shell 84 is attached to the insulator 81 to surround the coupling portion 83. The shell 84 is connected to an electroconductive back shell 85 formed on an outer wall surface of the insulator 81. The back shell 85 is covered by an insulating hood 87. The shell 84 of the cable connector 79 is electrically connected through the back shell 85 made of metal to a core of an insulated cable 89 connected to a stranded wire (a ground of the cable connector 79) of a cable 88.

Figure 26:
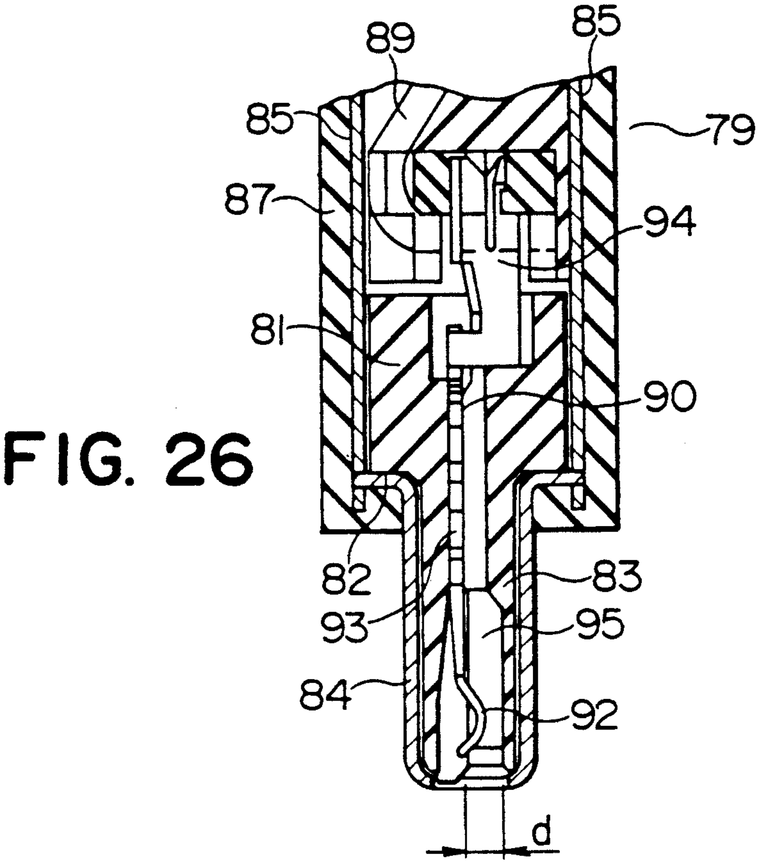
FIG. 26 is a sectional view taken along a line XXVI—XXVI illustrated in FIG. 23.

As illustrated in FIG. 26, a plurality of contacts 90 of a cantilevered type are mounted in the insulator 81. Each of the contacts 90 comprises a contact spring portion 92, a holding portion 93 connected to one end of the contact spring portion 92 and held in the insulator 81, and a terminal portion 94 connected to one end of the holding portion 93 and brought into press contact with the cable 89.

Figure 24:
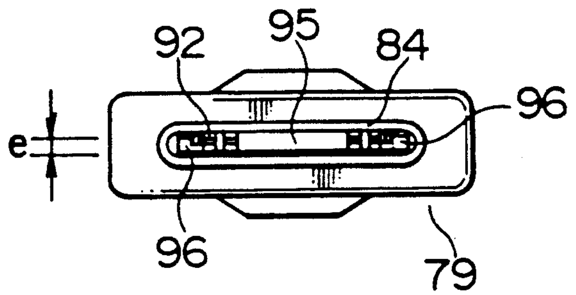
FIG. 24 is a front view of the cable connector illustrated in FIG. 23.
Figure 25:
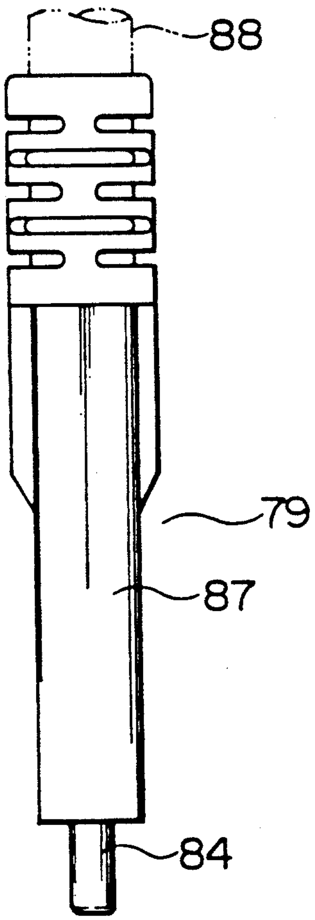
FIG. 25 is a side view of the cable connector illustrated in FIG. 23.

The coupling portion 83 has a receiving hole 95 for receiving the coupling portion 70 of the electric connector 14. A pair of receiving grooves 96 are formed at opposite ends of the receiving hole 95 (FIG. 24). The receiving grooves 96 have a size e slightly larger than the size b shown in FIG. 22. When the coupling portion 70 of the electric connector 14 is coupled to the coupling portion 83 of the cable connector 79 in a predetermined arrangement direction, the plate portion 71 of the coupling portion 70 is received in the receiving hole 95 of the coupling portion 83 to electrically connect the inner surface of the shell 17 of the electric connector 14 and the outer surface of the shell 84 of the cable connector 79. Simultaneously when the projecting portions 73 of the electric connector 14 are received in the receiving grooves 96 of the cable connector 79, each of the contact portions 21 is brought into contact with a corresponding one of the contact spring portions 92. The receiving hole 95 is located at an eccentric position on the main surface 82. When the coupling portion 70 illustrated in FIG. 22 is tried to be coupled to the connector 79 which is erroneously reversed leftside right in an arrangement direction, the shape of the projecting portions 73 does not match the receiving hole 92. Thus, coupling is inhibited.

As illustrated in FIGS. 18 through 26, the plate portion 71, along which the contacts 16 of the electric connector 14 are arranged, is formed at an eccentric position in a thickness direction within the shell 17. Correspondingly, the coupling portion 70 of the electric connector 14 are eccentrically arranged in the receiving hole 95 of the cable connector 79. With this structure, if the connectors are erroneously reversed in an arrangement direction with respect to each other, a coupling error is inhibited by mutual interference between the plate portion 71 and the contact portions 92 of the contacts 90. In FIG. 22, the size a of the plate portion 71 is small. In addition, the size d of the receiving hole 95 of the cable connector 79 to be coupled with the plate portion 71 having the size a is also small.

However, the electric connector 14 according to this invention has the projecting portions 73. If the connectors 14 and 79 are forcibly tried to be coupled against the mutual interference, the projecting portions 73 can not enter into the receiving hole 95. The plate portion 71 and the contact portions 92 are prevented from deformation. Thus, the erroneous coupling of the cable connector 79 to the electric connector 14 is inhibited without fail.

Referring to FIG. 22, since the total thickness b of the plate portion 71 and the projecting portions 73 is greater than the thickness of the plate portion 71, the thin plate portion 71 is reinforced.

In the embodiment described in conjunction with FIGS. 18 through 26, it is unnecessary to provide a locking mechanism for preventing erroneous coupling. As a result, the electric connector 14 has a reduced thickness and a small size and is still capable of inhibiting a coupling error.

Figure 27:
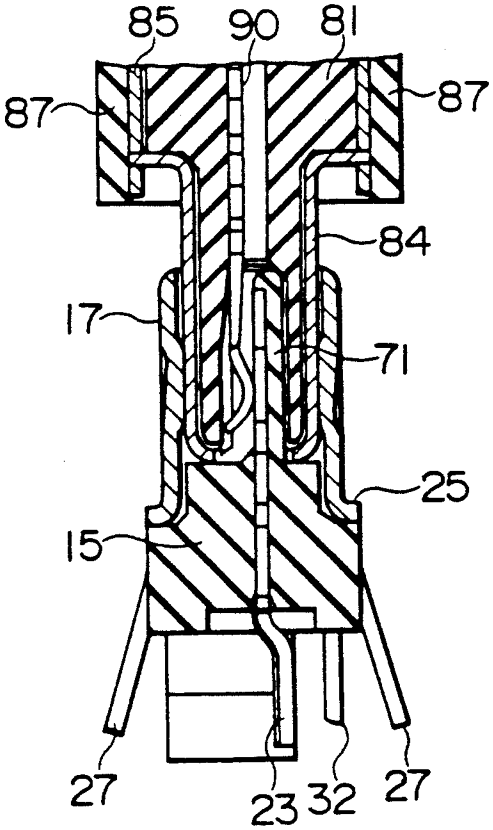
FIG. 27 is a sectional view of the electric connector illustrated in FIG. 22 connected to the cable connector illustrated in FIG. 26.

FIG. 27 shows the cable connector 79 and the electric connector 14 which are connected to each other. In this event, the shell 17 of the electric connector 14 is fitted to the shell 84 of the cable connector 79 outwardly of the shell 84. When thus coupled and connected, the contact portions 21 of the contacts 16 of the electric connector 14 and the contact portions 92 of the contacts 90 of the cable connector 79 are brought into press contact by a spring force of the contact portions 92.

A plurality of dimple portions 100 (FIG. 18) are formed on the shell 17 of the electric connector 14 to assure electric connection between the shell 17 and the shell 84 when the both connectors are coupled and connected.

In the foregoing embodiments, the shell 17 of the electric connector 14 is located outwardly of the shell 84 of the cable connector 79 when the electric connector 14 and the cable connector 79 are coupled to each other. In other words, the cable connector 79 is of a plug type. However, the electric connector 14 and the cable connector 79 may be inverted in structure. In other words, the shell 17 of the electric connector 14 may be located inwardly of the shell 93 of the cable connector 79.

What is claimed is:

1. An electric connector for use in an electric circuit board unit including a frame, an electric circuit board having terminal pads and supported by said frame, electroconductive plates fixedly mounted on said frame to face the opposite surfaces of said electric circuit board with a gap left between said electric circuit board and each of said electroconductive plates, and said electric connector attached to said frame to connect said electric circuit board to an external circuit, said electric connector comprising:

an insulator to be fixedly mounted on said frame;

a plurality of electroconductive contacts fixedly mounted on said insulator for connection with electroconductive mating contacts of a mating connector, each of said electroconductive contacts having a terminal portion to be connected to a corresponding one of said terminal pads;

an electroconductive shell fixedly mounted on said insulator and isolated from said contacts; and connecting means connected to said electroconductive shell and extending outwardly of said insulator, said connecting means being for connecting said electroconductive shell with said electroconductive plates when said electric connector is mounted on said frame of said electric circuit board unit.

2. An electric connector as claimed in claim 1, wherein said connecting means comprises at least one pair of protruding pieces, said pair of protruding pieces being disposed at opposite sides of said insulator and being elastically deformable.

3. An electric connector as claimed in claim 2, wherein said protruding pieces have top ends remote from said insulator, said top ends being spaced apart by a distance greater than said gap between said plates when said plates are fixedly mounted on said frame.

4. An electric connector as claimed in claim 1, wherein said electroconductive shell has a ground terminal to be connected to a ground pattern formed on said electric circuit board.

5. An electric connector as claimed in claim 1, wherein said insulator has engaging portions to be fitted to engaging recesses formed on said frame.

6. An electric connector as claimed in claim 1, wherein said insulator has a main surface and is provided with a coupling portion formed on the main surface, said electroconductive shell is attached to said insulator to surround said coupling portion, each of said electroconductive contacts has a contact portion, a holding portion connected to one end of said contact portion and held in said insulator, and a terminal portion connected to one end of said holding portion and projecting on a subsidiary surface of said insulator opposite to said main surface, and said coupling portion has a plate portion on which said contact portions are arranged along one surface thereof, and projecting portions formed on said main surface at both sides of said plate portion, said projecting portions projecting towards one surface of said electroconductive shell facing said one surface of said plate portion.

7. An electric connector as claimed in claim 6, wherein said plate portion is eccentrically located on said main surface so that a distance between said one surface of said plate portion and said one surface of said electroconductive shell is different from a distance between the other surface of said plate portion and the other surface of said electroconductive shell.

8. An electric connector as claimed in claim 6, wherein said contact portion is generally centered between said one surface and said other surface of said electroconductive shell.

9. A connector to be connected to an electric connector as claimed in claim 6, comprising an insulator, a plurality of electroconductive contacts fixedly mounted on said insulator, a coupling portion formed on a main surface of said insulator, and an electroconductive shell attached to said insulator to surround said coupling portion, each of said contacts comprising a contact spring portion, a holding portion connected to one end of said contact spring portion and held in said insulator, and a terminal portion connected to one end of said holding portion, said coupling portion having a receiving hole for receiving said coupling portion of said electric connector, said receiving hole being provided with receiving grooves at both ends thereof, said receiving hole being able to receive said projecting portion of said electric connector for permitting connection of said connector with said electric connector, whereby said plate portion of said coupling portion is received in said receiving hole so that the inner surface of said shell of said connector is electrically connected to the outer surface of a shell of said electric connector, with said spring contact portions being brought into contact with said contact portions.

10. A connector as claimed in claim 9, wherein said receiving hole is eccentrically located on said main surface.

11. An electric circuit board unit including a frame, an electric circuit board having terminal pads and supported by said frame, electroconductive plates fixedly mounted on said frame to face the opposite surfaces of said electric circuit board with a gap left between said electric circuit board and each of said electroconductive plates, and an electric connector attached to said frame to connect said electric circuit board to an external circuit, said electric connector comprising:

an insulator fixedly mounted on said frame;

a plurality of electroconductive contacts fixedly mounted on said insulator for connection with electroconductive mating contacts of a mating connector, each of said electroconductive contacts having a terminal portion connected to a corresponding one of said terminal pads;

an electroconductive shell fixedly mounted on said insulator and isolated from said contacts; and connecting means connected to said electroconductive shell and extending outwardly of said insulator, said connecting means connecting said electroconductive shell with said electroconductive plates.

* * * * *

UNITED STATES PATENT AND TRADEMARK OFFICE

CERTIFICATE OF CORRECTION

PATENT NO. : 5,306,196
DATED : April 26, 1994
INVENTOR(S) : Osamu Hashiguchi

It is certified that error appears in the above-identified patent and that said Letters Patent is hereby corrected as shown below:

Title Page -- [73] Assignee:
delete "NEC Corporation, Japan" and insert --Japan Aviation Electronics Industry Ltd , Tokyo, Japan.--

Signed and Sealed this

Fifteenth Day of June, 1999

Attest:

Q. TODD DICKINSON

*Attesting Officer*

*Acting Commissioner of Patents and Trademarks*